United States Patent
Liu et al.

(10) Patent No.: US 10,613,180 B2
(45) Date of Patent: Apr. 7, 2020

(54) METHODS AND SYSTEMS OF ASSESSING TISSUE VASCULAR PERMEABILITY USING NON-LABELED DEXTRAN

(71) Applicants: The Johns Hopkins University, Baltimore, MD (US); Kennedy Krieger Institute, Baltimore, MD (US)

(72) Inventors: Guanshu Liu, Timomium, MD (US); Peter C. M. Van Zijl, Ellicot City, MD (US); Yuguo Li, Baltimore, MD (US)

(73) Assignees: The Johns Hopkins University, Baltimore, MD (US); Kennedy Krieger Institute, Baltimore, MD (US)

( * ) Notice: Subject to any disclaimer, the term of this patent is extended or adjusted under 35 U.S.C. 154(b) by 831 days.

(21) Appl. No.: 15/123,492

(22) PCT Filed: Mar. 6, 2015

(86) PCT No.: PCT/US2015/019272
§ 371 (c)(1),
(2) Date: Sep. 2, 2016

(87) PCT Pub. No.: WO2015/134918
PCT Pub. Date: Sep. 11, 2015

(65) Prior Publication Data
US 2017/0074958 A1    Mar. 16, 2017

Related U.S. Application Data

(60) Provisional application No. 61/949,019, filed on Mar. 6, 2014.

(51) Int. Cl.
*G01R 33/56* (2006.01)
*G01R 33/563* (2006.01)
(Continued)

(52) U.S. Cl.
CPC ..... *G01R 33/5601* (2013.01); *G01R 33/4828* (2013.01); *G01R 33/50* (2013.01); *G01R 33/5605* (2013.01); *G01R 33/56366* (2013.01)

(58) Field of Classification Search
CPC ............ G01R 33/5601; G01R 33/5605; G01R 33/56366; G01R 33/4828; G01R 33/50
See application file for complete search history.

(56) References Cited

U.S. PATENT DOCUMENTS 5,213,788 A * 5/1993 Ranney .................. A61K 49/06
424/617
6,963,769 B1 * 11/2005 Balaban ................. A61B 5/055
324/307

(Continued)

OTHER PUBLICATIONS

Armstrong et al., "The Hydrodynamic Radii of Macromolecules and Their Effect on Red Blood Cell Aggregation," Biophys. J. 2004, 87, pp. 4259-4270.

(Continued)

*Primary Examiner* — Bo Joseph Peng
(74) *Attorney, Agent, or Firm* — Venable LLP; Henry J. Daley; Laura G. Remus

(57) ABSTRACT

A method of assessing tissue vascular permeability for nanotherapeutics using non-labeled dextran can include: receiving a non-labeled, physiologically-tolerable dextran solution by a subject; acquiring a plurality of magnetic resonance images of a distribution of the dextran solution within at least one region of interest of the subject for a corresponding plurality of times; and assessing a tissue vascular permeability of the at least one region of interest to dextran particles in the dextran solution based on differences between the plurality of magnetic resonance images, wherein the dextran solution is a substantially mono-disperse solution of dextran particles of one size.

26 Claims, 4 Drawing Sheets

(51) Int. Cl.
G01R 33/48 (2006.01)
G01R 33/50 (2006.01)

(56) References Cited

U.S. PATENT DOCUMENTS

| 7,683,617 B2 | 3/2010 | Van Zijl et al. |
| 8,536,866 B2 | 9/2013 | Van Zijl et al. |
| 2004/0024317 A1 | 2/2004 | Uzgiris |
| 2012/0179029 A1 | 7/2012 | Kircher et al. |

OTHER PUBLICATIONS

Chan et al., "Natural D-Glucose as a biodegradable MRI contrast agent for detecting cancer," Magn. Reson. Med., 2012, 68(6): 1764-1773.

Chauhan et al., "Normalization of tumour blood vessels improves the delivery of nanomedicines in a size-dependent matter," Nat. Nanotechnol., 2012, 7(6): 383-388.

Dreher et al., "Tumor Vascular Permeability, Accumulation, and Penetration of Macromolecular Drug Carriers," J. Natl. Cancer Inst. 2006, 98, pp. 335-344.

Liu et al., "High-Throughput Screening of Chemical Exchange Saturation Transfer MR Contrast Agents," Contrast Media Mol. Imaging, 2010, 5(3): 162-170.

Reitan et al., "Characterization of tumor microvascular structure and permeability: comparison between magnetic resonance imaging and intravital confocal imaging," Journal of Biomedical Optics, 2010, vol. 15, No. 3, 036004, 11 pages.

Tassa et al., "Dextran-coated iron oxide nanoparticles: a versatile platform for targeted molecular imaging, molecular diagnostics, and therapy," Accounts of Chemical Research, 2011. vol. 44, No. 10, pp. 842-852.

Winter, "Magnetic resonance chemical exchange saturation transfer imaging and nanotechlology," Wiley Interdisciplinary Reviews: Nanomedicine and Nanobiotechnology, 2012, vol. 4, Issue No. 4, pp. 389-398.

\* cited by examiner

METHODS AND SYSTEMS OF ASSESSING TISSUE VASCULAR PERMEABILITY USING NON-LABELED DEXTRAN

CROSS REFERENCE TO RELATED APPLICATIONS

This application claims priority to U.S. Provisional Patent Application No. 61/949,019, filed Mar. 6, 2014, which is hereby incorporated herein by reference in its entirety.

FEDERAL FUNDING

This invention was made with government support under Grant No. R21EB015609 awarded by the National Institutes of Health (NIH). The government has certain rights in the invention.

BACKGROUND

1. Field of Invention

The field of the currently claimed embodiments of this invention relates to systems and methods of assessing tissue vascular permeability, and more particularly systems and methods of assessing tissue vascular permeability using non-labeled dextran.

2. Discussion of Related Art

Assessing tumor vascular permeability has important applications in clinical diagnosis and for the development of personalized nanoparticulate therapeutics. Most current approaches use radioactive, paramagnetic, and/or non-abundant magnetically enriched isotopes to label contrast agents to assess tumor vascular permeability. These approaches not only include a certain level of health risk, they add cost and time to the procedures, and potentially adversely affect the acquired data.

Therefore, there remains a need for improved systems and methods of assessing tissue vascular permeability.

SUMMARY

A method of assessing tissue vascular permeability for nanotherapeutics using non-labeled dextran, comprising: receiving a non-labeled, physiologically-tolerable dextran solution by a subject; acquiring a plurality of magnetic resonance images of a distribution of the dextran solution within at least one region of interest of the subject for a corresponding plurality of times; and assessing a tissue vascular permeability of the at least one region of interest to dextran particles in the dextran solution based on differences between the plurality of magnetic resonance images, wherein the dextran solution is a substantially mono-disperse solution of dextran particles of one size.

A non-transitory, computer-readable storage medium for assessing tissue vascular permeability using non-labeled dextran can include computer executable instructions that, when executed by a computer, cause the computer to perform: acquiring a plurality of magnetic resonance images of a distribution of a non-labeled, physiologically-tolerable dextran solution that has been received by a subject, wherein the acquiring step acquires the plurality of magnetic resonance images within at least one region of interest for a corresponding plurality of times; and assessing a tissue vascular permeability of the at least one region of interest to dextran particles in the dextran solution based on differences between the plurality of magnetic resonance images, wherein the dextran solution is a substantially mono-disperse solution of dextran particles of one size.

A system for assessing tissue vascular permeability using non-labeled dextran can include: a data processing system; and a display system configured to communicate with the data processing system, wherein the data processing system comprises non-transitory, executable instructions that, when executed by the data processing system, causes the data processing system to perform: acquiring a plurality of magnetic resonance images of a distribution of a non-labeled, physiologically-tolerable dextran solution that has been received by a subject, wherein the acquiring step acquires the plurality of magnetic resonance images within at least one region of interest for a corresponding plurality of times; and assessing a tissue vascular permeability of the at least one region of interest to dextran particles in the dextran solution based on differences between the plurality of magnetic resonance images, wherein the dextran solution is a substantially mono-disperse solution of dextran particles of one size.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

Further objectives and examples will become apparent from a consideration of the description, drawings, and examples.

DETAILED DESCRIPTION

Figure 1:
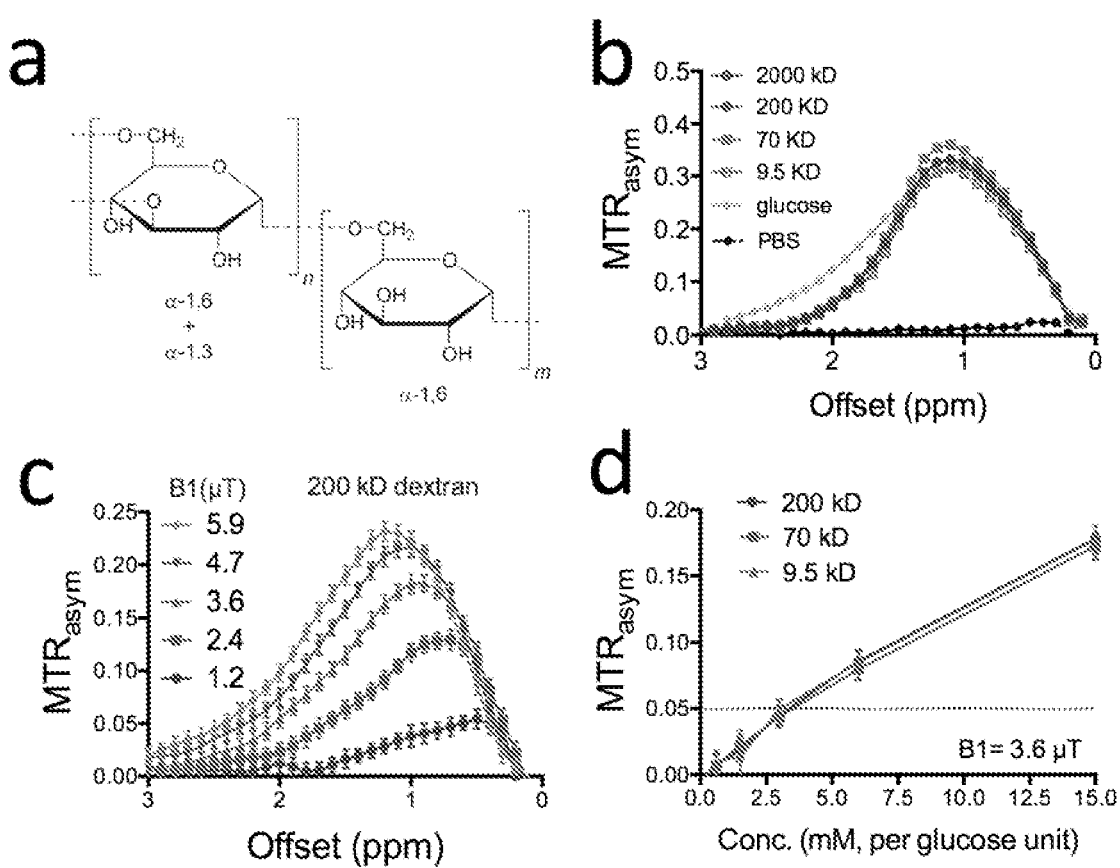
FIG. 1 shows dextran properties, according to an embodiment of the present invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The phrase "substantially mono-disperse solution of dextran particles of one size" means that the dextran particles are the same size to within about ±10%.

The phrase "non-labeled dextran" refers to dextran molecules that are not radioactive, not paramagnetic, and do not contain non-abundant magnetically enriched isotopes.

The term "computer" is intended to have a broad meaning that may be used in computing devices such as, e.g., but not limited to, standalone or client or server devices. The computer may be, e.g., (but not limited to) a personal computer (PC) system running an operating system such as, e.g., (but not limited to) MICROSOFT® WINDOWS® NT/98/2000/XP/Vista/Windows 7/8/etc. available from MICROSOFT® Corporation of Redmond, Wash., U.S.A. or an Apple computer executing MAC® OS from Apple® of Cupertino, Calif., U.S.A. However, the invention is not limited to these platforms. Instead, the invention may be implemented on any appropriate computer system running any appropriate operating system. In one illustrative embodiment, the present invention may be implemented on a computer system operating as discussed herein. The computer system may include, e.g., but is not limited to, a main memory, random access memory (RAM), and a secondary memory, etc. Main memory, random access memory (RAM), and a secondary memory, etc., may be a computer-readable medium that may be configured to store instructions configured to implement one or more embodiments and may comprise a random-access memory (RAM) that may include RAM devices, such as Dynamic RAM (DRAM) devices, flash memory devices, Static RAM (SRAM) devices, etc.

The secondary memory may include, for example, (but is not limited to) a hard disk drive and/or a removable storage drive, representing a floppy diskette drive, a magnetic tape drive, an optical disk drive, a compact disk drive CD-ROM, flash memory, etc. The removable storage drive may, e.g., but is not limited to, read from and/or write to a removable storage unit in a well-known manner. The removable storage unit, also called a program storage device or a computer program product, may represent, e.g., but is not limited to, a floppy disk, magnetic tape, optical disk, compact disk, etc. which may be read from and written to the removable storage drive. As will be appreciated, the removable storage unit may include a computer usable storage medium having stored therein computer software and/or data.

In alternative illustrative embodiments, the secondary memory may include other similar devices for allowing computer programs or other instructions to be loaded into the computer system. Such devices may include, for example, a removable storage unit and an interface. Examples of such may include a program cartridge and cartridge interface (such as, e.g., but not limited to, those found in video game devices), a removable memory chip (such as, e.g., but not limited to, an erasable programmable read only memory (EPROM), or programmable read only memory (PROM) and associated socket, and other removable storage units and interfaces, which may allow software and data to be transferred from the removable storage unit to the computer system.

The computer may also include an input device may include any mechanism or combination of mechanisms that may permit information to be input into the computer system from, e.g., a user. The input device may include logic configured to receive information for the computer system from, e.g. a user. Examples of the input device may include, e.g., but not limited to, a mouse, pen-based pointing device, or other pointing device such as a digitizer, a touch sensitive display device, and/or a keyboard or other data entry device (none of which are labeled). Other input devices may include, e.g., but not limited to, a biometric input device, a video source, an audio source, a microphone, a web cam, a video camera, and/or other camera. The input device may communicate with a processor either wired or wirelessly.

The computer may also include output devices which may include any mechanism or combination of mechanisms that may output information from a computer system. An output device may include logic configured to output information from the computer system. Embodiments of output device may include, e.g., but not limited to, display, and display interface, including displays, printers, speakers, cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), etc. The computer may include input/output (I/O) devices such as, e.g., (but not limited to) communications interface, cable and communications path, etc. These devices may include, e.g., but are not limited to, a network interface card, and/or modems. The output device may communicate with processor either wired or wirelessly. A communications interface may allow software and data to be transferred between the computer system and external devices.

The term "data processor" is intended to have a broad meaning that includes one or more processors, such as, e.g., but not limited to, that are connected to a communication infrastructure (e.g., but not limited to, a communications bus, cross-over bar, interconnect, or network, etc.). The term data processor may include any type of processor, microprocessor and/or processing logic that may interpret and execute instructions (e.g., for example, a field programmable gate array (FPGA)). The data processor may comprise a single device (e.g., for example, a single core) and/or a group of devices (e.g., multi-core). The data processor may include logic configured to execute computer-executable instructions configured to implement one or more embodiments. The instructions may reside in main memory or secondary memory. The data processor may also include multiple independent cores, such as a dual-core processor or a multi-core processor. The data processors may also include one or more graphics processing units (GPU) which may be in the form of a dedicated graphics card, an integrated graphics solution, and/or a hybrid graphics solution. Various illustrative software embodiments may be described in terms of this illustrative computer system. After reading this description, it will become apparent to a person skilled in the relevant art(s) how to implement the invention using other computer systems and/or architectures.

The term "data storage device" is intended to have a broad meaning that includes removable storage drive, a hard disk installed in hard disk drive, flash memories, removable discs, non-removable discs, etc. In addition, it should be noted that various electromagnetic radiation, such as wireless communication, electrical communication carried over an electrically conductive wire (e.g., but not limited to twisted pair, CAT5, etc.) or an optical medium (e.g., but not limited to, optical fiber) and the like may be encoded to carry computer-executable instructions and/or computer data that embodiments of the invention on e.g., a communication network. These computer program products may provide software to the computer system. It should be noted that a computer-readable medium that comprises computer-executable instructions for execution in a processor may be configured to store various embodiments of the present invention.

Some embodiments of the current invention are directed to a procedure of using non-labeled (i.e., not radioactive, not paramagnetic, and not containing non-abundant magnetically enriched isotopes) dextran for non-invasively assessing tissue vascular permeability and potentially, assessing tissue perfusion and monitoring nanoparticulate drug delivery with MRI. In one embodiment, a method of assessing tissue vascular permeability for nanotherapeutics using non-labeled dextran is disclosed. While various embodiments of this method are disclosed throughout this section, it is to be understood that a non-transitory, computer readable medium or a data processing system can include instructions that when executed by at least one computer or data processing system, respectively, cause a computer or data processing system to perform analogous steps to the method embodiment.

Further, computer readable media can include instructions that when executed cause a computer or a data processing system to perform acquiring a plurality of magnetic resonance images of a distribution of a non-labeled, physiologically-tolerable dextran solution that has been received by a subject. In this embodiment, the acquiring step can acquire the plurality of magnetic resonance images within at least one region of interest for a corresponding plurality of times.

In one embodiment, the method includes receiving a non-labeled, physiologically-tolerable dextran solution into a subject. The term "receiving" is intended to be broadly defined to encompass dispersing, administering, dispensing, applying, delivering, distributing, infusing and/or supplying the non-labeled dextran into the subject. Thus, a subject can receive a non-labeled, physiologically-tolerable dextran solution.

The method can include acquiring a plurality of magnetic resonance images of a distribution of the dextran solution within at least one region of interest of the subject for a corresponding plurality of times. The method can include assessing a tissue vascular permeability of the at least one region of interest to dextran particles in the dextran solution based on differences between the plurality of magnetic resonance images. The dextran solution can be a substantially mono-disperse solution of dextran particles of one size.

Accordingly, some embodiments of the present invention use the MRI signal of non-labeled dextran, a category of highly safe polysaccharides, to assess tissue perfusion and the selective permeability to various particular particle sizes. There is no need for radioactive, paramagnetic labeling of dextran to obtain an imageable signal. Dextrans are non-toxic, natural and biodegradable agents and have been used in clinical practices for other medical purposes for a long history. Dextrans resemble nanoparticles with the size ranging from 4-60 nm, enabling the MRI measurement of the vascular permeability to different particle sizes in the targeted tissue in a selected subject, in a fashion of personalized medicine. This procedure (process) may replace the use of paramagnetic contrast agents to image tumor permeability and drug delivery with MRI. Standard MRI scanners can be used for this procedure, which means no special hardware is required.

The method can further include, subsequent to the receiving the above-mentioned dextran solution and acquiring the plurality of magnetic resonance images, i) receiving a second, non-labeled, physiologically-tolerable dextran solution into the patient; ii) acquiring a second plurality of magnetic resonance images of a distribution of the second dextran solution within the same at least one region of interest for a corresponding plurality of times; iii) assessing a second tissue vascular permeability of the at least one region of interest to the second dextran particles based on differences between the second plurality of magnetic resonance images; and iv) determining a range of operability for nanotherapeutics of similar size based on the vascular permeability of the two sizes of dextran particles. In this embodiment, the second dextran solution can be a substantially mono-disperse solution of dextran particles of one size that is different from the one size of the first-mentioned dextran solution. The determining the range can be based on the first mentioned and the second dextran particles. For example, the determining the range can be based on the vascular permeability of the two sizes of dextran particles.

Thus, in some embodiments, administration of dextran of different molecular weights, and thus different particle sizes, can be used to assess the selective tissue uptake, accumulation, and subsequent clearance in the targeted tissues to different sized particles using chemical exchange saturation transfer MRI or other MRI approaches. This can be used as a clinical procedure for multiple applications. One of these applications can be as a non-toxic substitute for small molecular or macromolecular paramagnetic contrast agents (dynamic or static contrast-enhanced MRI), which are the current choice for clinical perfusion imaging with MRI. Applications may encompass the total clinical areas related to pharmacokinetics of nanoparticles, including assessment of vascular permeability in the targeted tissues, monitoring of tissue-selective drug delivery, or assessing kidney function, for example. An important application can be to stratify cancer patients to receive the appropriate nano-chemotherapy regime.

In an embodiment, the method can further include repeating the receiving dextran of a different size and acquiring and assessing steps a plurality of times for a corresponding plurality of dextran solutions.

To our best knowledge there are no publications of the use of dextran of different molecular weights for the assessment of tissue perfusion and permeability, and kidney clearance as monitored by MRI.

Papers related to background and conventional methodologies are cited below. Known MRI pulse sequences can be used for the data acquisition (see below B1-B3). Some embodiments of the current invention are directed to clinical procedures of intravenous administration of dextrans of a series of molecular weights and MRI detection together with extents for processing and displaying the data. In an embodiment, dextran particles can have a molecular weight of at least 3 kD and less than 2,000 kD. In another non-mutually exclusive embodiment, the dextran particles can have a molecular weight of at least 3 kD and less than 40 kD. In an embodiment, the second dextran particles can have a molecular weight larger than the first-mentioned dextran particles. In another embodiment, the first-mentioned dextran particles can have a larger molecular weight than the second dextran particles. In another embodiment, the molecular weight of the second dextran particles and the first-mentioned dextran particles can be substantially the same, and the size of the two types of particles can be different.

B1: Balaban; Robert S. (Bethesda, Md.), Ward; Kathleen M. (Arlington, Va.), Aletras; Anthony H. (Rockville, Md.); U.S. Pat. No. 6,963,769; PCT/US00/10878, published Nov. 8, 2005.

B2: van Zijl, Peter (Ellicott City, Md.), Jones, Craig (Ilderton, Canada), U.S. Pat. No. 7,683,617; PCT/US2006/028314, Mar. 23, 2010.

B3: van Zijl, Peter (Ellicott City); Kim, Mina and Gillen, Joseph. Frequency Referencing Method for Chemical Exchange Saturation Transfer (CEST) MRI; JHU disclosure C10151, 2007.

In FIG. 1, element (a) displays a chemical structure of dextran; element (b) displays MW (size) dependence of CEST contrast; element (c) displays the $B_1$ dependence of CEST contrast of 15 mM (per glucose unit) 200 kD dextran; and element (d) displays sensitivity of dextran at three sizes for $B_1$=3.6 µT.

Thus, in one embodiment of the present invention, the acquiring step can acquire a plurality of chemical exchange saturation transfer (CEST) magnetic resonance images. In an embodiment, the acquiring step can acquire a plurality of measurements to assess changes in T1rho, T2 or T2* relaxation.

Figure 2:
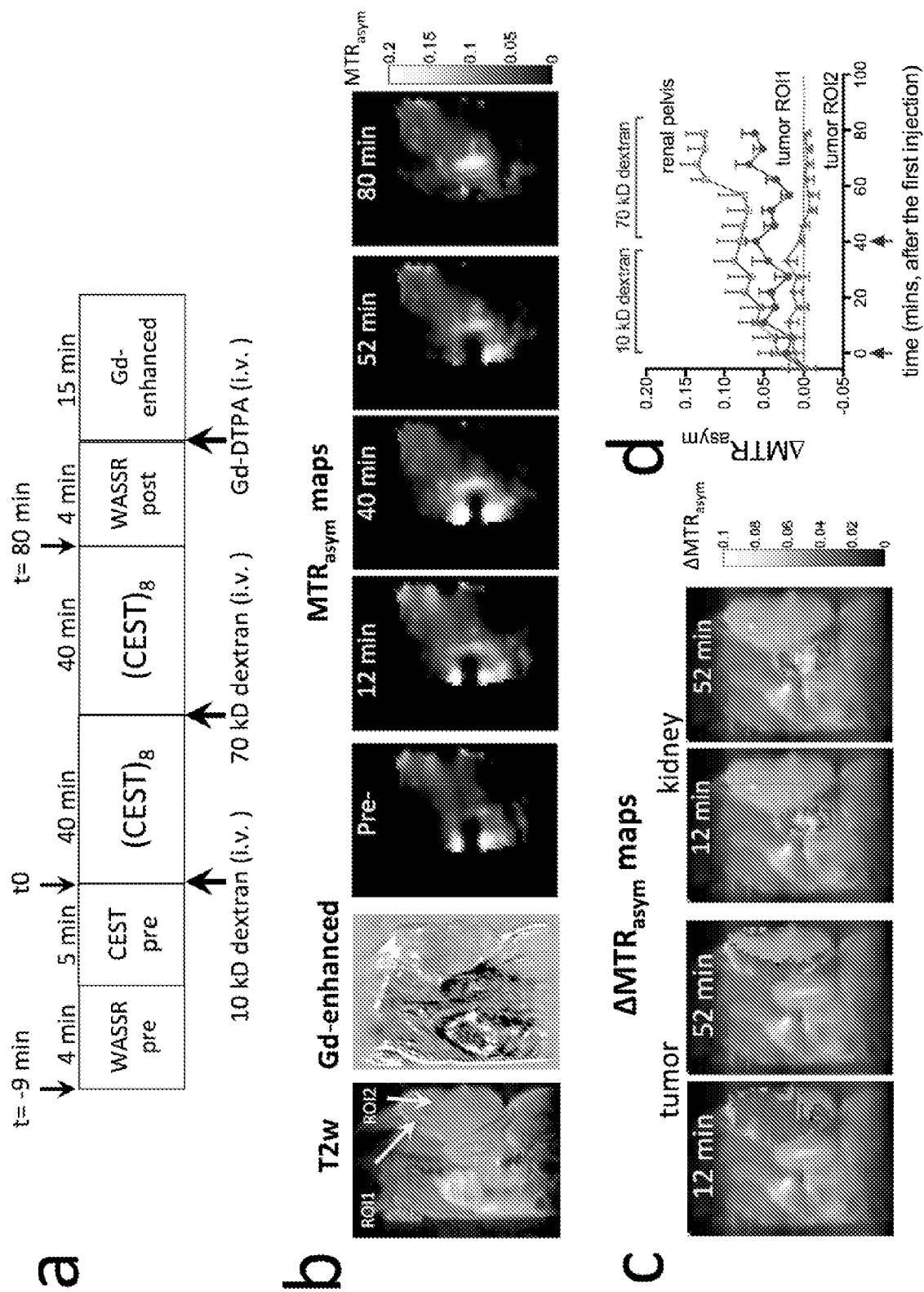
FIG. 2 shows an in vivo CEST MRI of dextran uptake in tumor and kidney, according to an embodiment of the present invention.

In FIG. 2, element (a) displays an imaging protocol of various compounds. Element (b) of FIG. 2 displays T2-w, Gd-DTPA enhanced T1-w, and CEST contrast maps at different time points. Element (c) of FIG. 2 displays the $\Delta MTR_{asym}$ maps of only tumor and kidney at 17 minutes and 57 minutes after the experiment started (12 minutes after the injection of 10 kD or 70 kD dextran). Element (d) of FIG. 2 displays a change of mean ROI CEST contrast in the two tumor ROIs and the renal pelvis. The changes were quantified by $\Delta MTR_{asym}(t)=MTR_{asym}(t)-MTR_{asym}(t0)$. Methods: a pre-scan was acquired using a segmented CEST acquisition with offsets ranging from 0.4 to 1.6 ppm (step=0.2 ppm). Mice were injected i.v. with 300 µL 10 kD dextran PBS solution (size~4 nm, 375 mg/kg bw) followed by eight repeated segmented CEST acquisitions. Then 300 µL 70 kD dextran solution was injected at the same dose and the imaging was repeated. Each acquisition took ~5 minutes. A fat-suppressed RARE sequence with a continuous wave pre-saturation pulse B1=1.8 µT and 3 seconds (TR/TE=5000/5 ms, RARE factor=10)$^2$ was used. After CEST acquisition, contrast enhanced images were acquired using a T1-w spin echo sequence (TR/TE=500/10 ms) before and 15 minutes after i.v. injection of Gd-DTPA (0.5 mmol/kg; 0.1 ml bolus over about 3 s).

Figure 3:
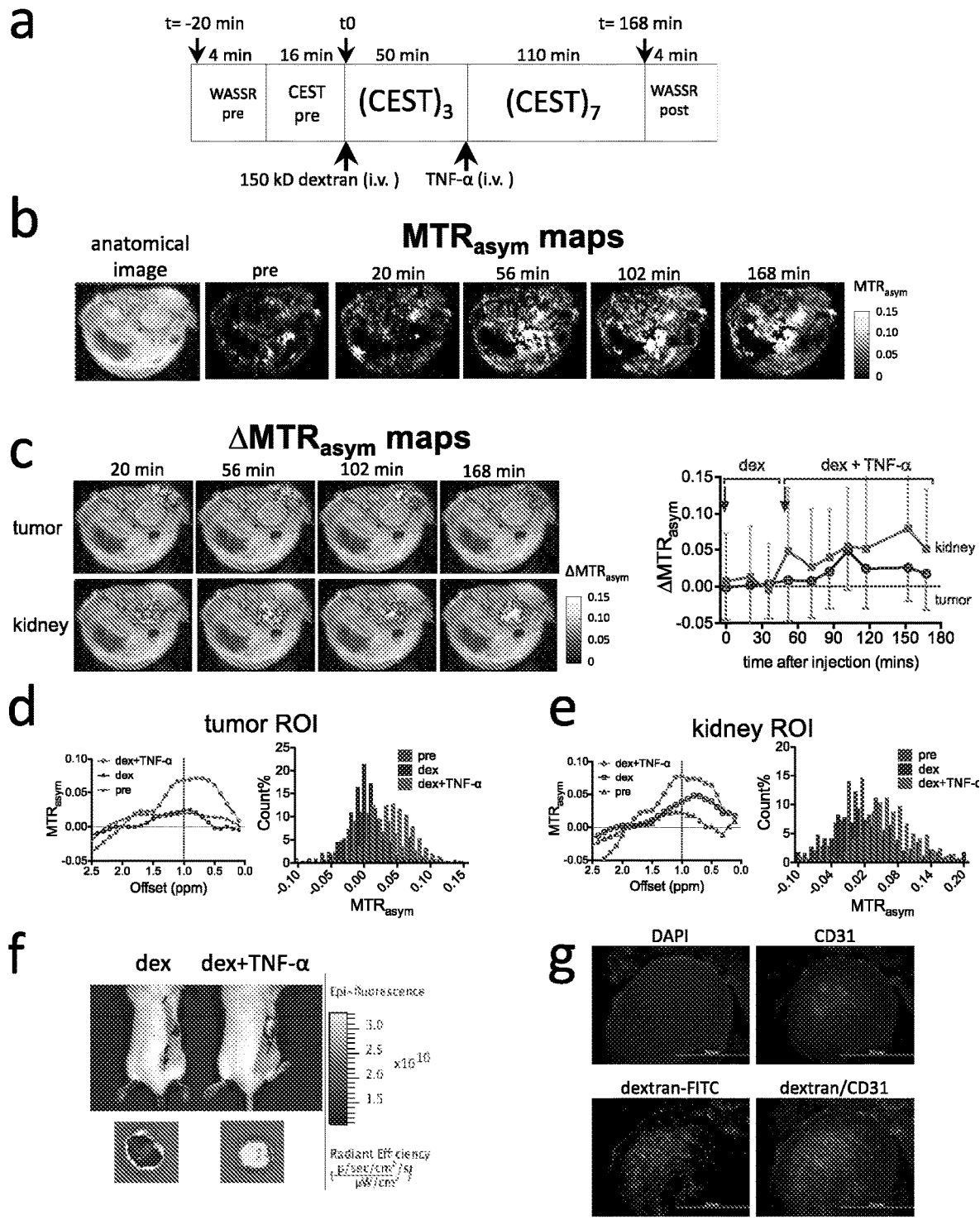
FIG. 3 shows use of high MW dextran to assess the responses in tumor vascular permeability to vasculature modulating agent TNF-α, according to an embodiment of the present invention.

In FIG. 3, element (a) displays the MRI acquisition protocol. Element (b) of FIG. 3 displays the anatomic image and the $MTR_{asym}$ maps at several time points before and after the injection. Element (c) of FIG. 3 displays the calculated $\Delta MTR_{asym}(t)=MTR_{asym}(t)-MTR_{asym}(pre))$ in the tumors or kidneys. The changes of mean ROI CEST contrast of tumor and kidney are plotted on the right. Element (d) of FIG. 3 displays the mean $MTR_{asym}$ plots (left) and histogram analysis (right) of tumor before, ~1 hour after the injection of dextran and ~1 hour after the injection of TNF-α. Element (e) of FIG. 3 displays the mean $MTR_{asym}$ plots (left) and histogram analysis (right) of kidney before, ~1 hour after the injection of dextran and ~1 hour after the injection of TNF-α. Element (f) of FIG. 3 displays in vivo and ex vivo fluorescence imaging by fluorescein that is conjugated with dextran, clearly showing a markedly augmented dextran uptake in tumor by the function of TNF-α. Element (g) of FIG. 3 displays the corresponding immunohistochemistry of the tumor as stained by DAPI and anti-CD31 for tumor cells and endothelial cells respectively. The dextran can be also imaged by its conjugated fluorescein (FITC). The overlaid images of anti-CD31 and dextran-FITC clearly showed the extravasation of dextran.

Figure 4:
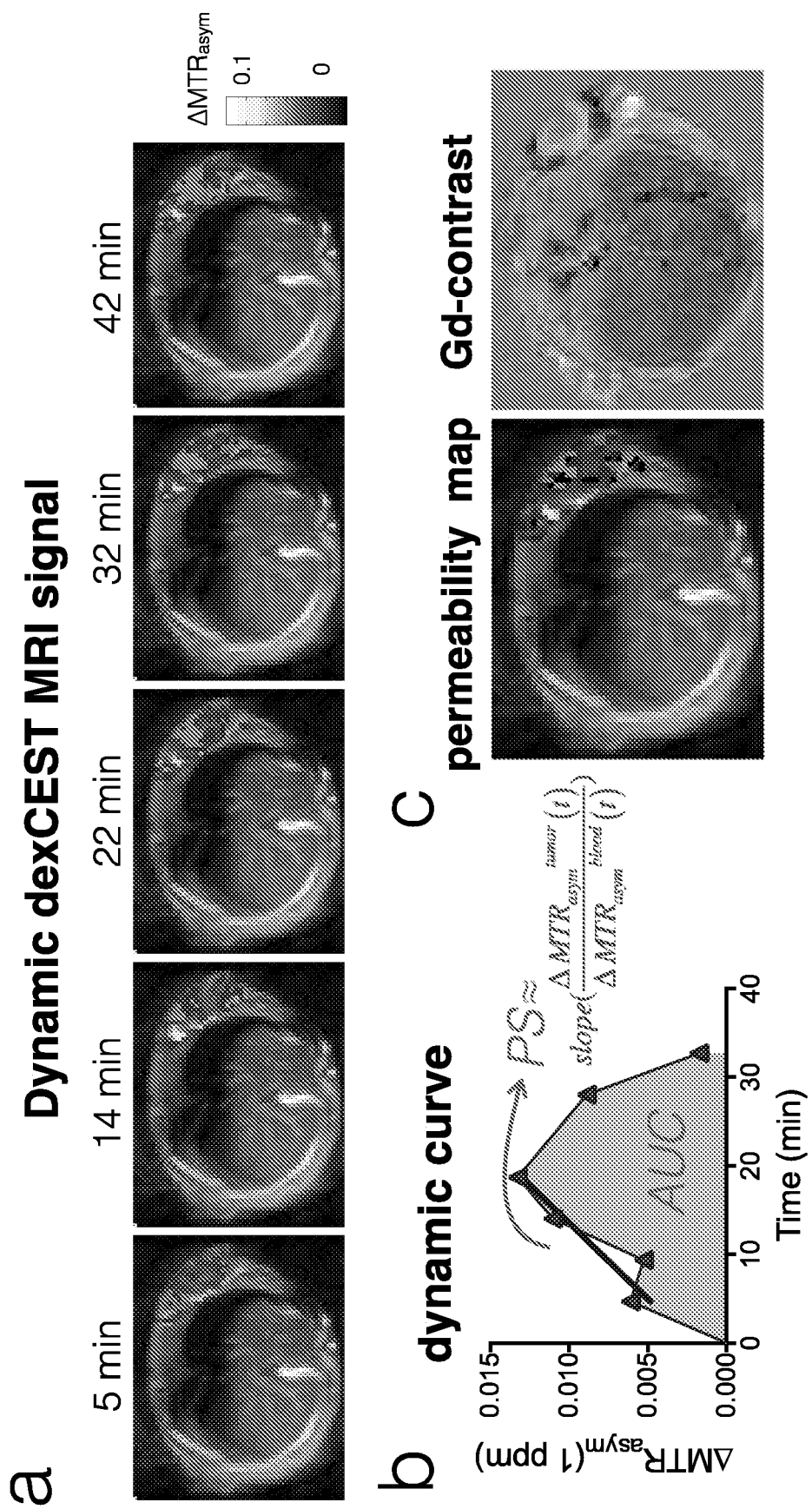
FIG. 4 shows quantification of the tumor permeability of PDAC tumors using 10 kD dextran, according to an embodiment of the present invention.

Element (a) of FIG. 4 displays the $\Delta MTR_{asym}$ at different time points, which is approximately linear with the concentration of dextran taken up by PDAC tumors at each time point after the injection of 10 kD dextran (200 mg/kg, i.v.). Element (b) of FIG. 4 shows that based on the dynamic CEST MRI signal, we can calculate the area under the concentration curve (□AUC of $\Delta MTR_{asym}$)□ and the initial slope of the dynamic curve to determine the tumor permeability to 10 kD dextran particles. Element (c) of FIG. 4 shows the calculated tumor permeability maps and the corresponding dynamic contrast-enhanced (DCE) T1w image obtained using 0.1 mmol/kg GdDTPA. The hypopermeable tumor core and hyper-permeable tumor rims can be identified in both CEST MRI and DCE MRI.

EXAMPLES

The following examples help explain some concepts of the current invention. The broad concepts of the current invention are not limited to the particular examples.

Here, we explored dextran as a potential Chemical Exchange Saturation Transfer (CEST) imaging agent by utilizing the CEST contrast originating from OH protons on the glucose units. Contrast was studied for particle sizes ranging from 4-60 nm. Dextrans of different molecular weights could be readily detected using CEST MRI. The differential permeability of an experimental tumor to dextrans sized at 4 and 14 nm was detected and renal clearance of the agents was also monitored.

Purpose: To exploit natural dextrans (FIG. 1a) as MRI contrast agents for assessing the size window of tumor vascular permeability, which has applications for clinical diagnostics and for developing nanoparticulates of appropriate sizes to maximize their tumor targeted delivery for treatment[1].

Methods: Dextrans of molecular weight (MW)=9.5, 70, 200 and 2000 kD and D-glucose were prepared at a concentration of 5 mg/ml (28 mM per glucose unit) in PBS buffer (pH=7.3) and assessed for their CEST contrast on a vertical bore Bruker 11.7 T MRI scanner equipped with a 15 mm volume coil as described previously.[3] In vivo MR studies were carried out on a Biospec11.7 T horizontal MRI scanner equipped with a 23 mm mouse brain volume coil. For dextrans of 10 kD and 70 kD, MR images were acquired according to the protocol in FIG. 2a to monitor the changes in CEST contrast upon i.v. injection of dextran to Balb/c mice bearing CT26 colon tumors in the flank (~350 mm$^3$, 14 days after the implantation of 5×106 CT26 cells). Details of the MRI study are provided in the caption of FIG. 2. For dextran of 150 kD, a slightly different protocol was used (FIG. 3a). In brief, mice (n=3) were first injected with 300 µL 150 kD dextran PBS solution (375 mg/kg bw). One hour later, TNF-α (1 µg per mouse) was injected. The CEST MRI was acquired using a series of z spectral imaging acquisition (from −3 ppm to +3 ppm, step=0.2 ppm). Each acquisition took ~16 minutes. For all the studies, a fat-suppressed RARE sequence with a continuous wave pre-saturation pulse B1=1.8 µT and 3 seconds (TR/TE=5000/5 ms, RARE factor=10)$^2$ was used. Data were processed using custom-written MATLAB scripts. After correcting for B0 inhomogeneity using the WASSR method, the in vivo CEST contrast was quantified by averaging the MTRasym=$(S^{-\Delta\omega}-S^{+\Delta\omega})/S_0$ from 0.8 to 1.2 ppm.[2]

Results: In vitro phantom studies (FIG. 1b) revealed that different MW dextrans and glucose share a similar CEST contrast pattern, e.g. resonant at ~1 ppm when $B_1$=3.6 µT was used. Similar to glucose, dextrans also exhibit a highly $B_1$-dependent CEST pattern (FIG. 1c), with signal increasing at higher $B_1$ for the fast exchanging OH protons. The apparent shift of the curve to higher frequency is due to broadening of the direct saturation and not a real effect. Element (d) of FIG. shows that ~5% CEST contrast can be generated per 3 mM glucose unit concentration, which, for example, corresponds to ~0.3 µM dextran for a MW of 200 kD. As a first in vivo demonstration, we injected two dextrans (9.5 and 70 kD, 4 and 14 nm in radius respectively) in mice bearing CT26 tumors to assess the differential permeability of the tumor to particles of different sizes.

Because low MW dextran will be quickly cleared from plasma and tumor according to the literature[4], we injected the low MW dextran first (FIG. 2a), followed by the high MW dextran after a sufficiently long interval (e.g. >40 min). This allowed detection of the pharmacokinetics of both dextrans in the same tumor within a single MRI session. FIG. 2b shows the CEST contrast maps at different time points before and after injection. To better show the CEST enhancement, we also display $\Delta MTR_{asym}$ at different time points in specific tumor and kidney regions (FIGS. 2c & 2d). The results clearly show a differential vascular permeability of the studied tumor to dextrans of different sizes, with 10 kD dextran (~4 nm) penetrating deeply into the tumor while 70 kD dextran (~14 nm) only accumulates in the tumor periphery. Interestingly, the contrast enhancement obtained by 70 kD dextran was similar to the Gd-enhanced image (FIG. 2b). As expected, dextran of 4 nm size was cleared through kidney, as evidenced by the continuously increasing CEST contrast in kidney after injection (FIGS. 2c & 2d). Furthermore, we also examined the tumor uptake of dextran of 150 kD. As shown both in the MR images (FIGS. 3b & 3c) and in vivo fluorescence images (FIG. 3f), the injection of dextran alone did not lead to a detectable dextran level in tumor except in several small regions in the CEST MRI maps, which are likely due to those dextrans that are circulating in large blood vessels. In contrast, the administration of TNF-α resulted in an instant effect in kidney and a slightly lagged effect in the augmentation of dextran accumulation in tumor and kidney as can be seen in the later time points in elements (b) and (c) of FIG. 3, indicating an increased vascular permeability in these tissues, presumably due to the effect of TNF-α on endothelial cells. At selected time points, we also performed a comprehensive ROI analysis of the CEST MRI signal within tumor or kidney. As shown in FIG. 3d, the mean MTRasym plots in tumor clearly showed a remarkably different shape than that of pre-injection only after the injection of TNF-α, reflecting a significant change in tumor vascular permeability by the function of TNF-α. The same trend can be found in kidney (FIG. 3e). Using fluorophore labeled dextran (i.e., dextran-FITC), we could use fluorescence imaging (FIG. 3f) and immunohistochemistry (FIG. 3g) to validate our MRI findings. These results clearly showed a marked increased dextran uptake in tumors by the function of TNF-α and the uptaken dextran have been extravasated and spread out in the majority of tumor parenchyma.

Discussion: The particle size (diameter) of dextran has been well studied, i.e., 4, 14, 20 and 54 nm for MW=10, 70, 200 and 2000 kD respectively[5], which enables the exploitation of dextrans of different MW to assess the window of tumor vascular permeability. Here, we showed that CEST MRI could be used to assess the differential permeability of the tumor to ~10 kD dextran (4 nm), and 70 kD dextran (14 nm). It should be noted that the size of 70 kD dextran is slightly above the critical size to have an Enhanced Permeability and Retention (EPR) effect (i.e. >12 nm in diameter)[1]. In contrast, due to the large hydrodynamic size, high MW dextran (i.e., 150 kD, diameter ~20 nm) tends not to accumulate in untreated tumors. However, when the vascular permeability is augmented by vasculature targeted agents such as TNF-α, high MW dextrans become permeable and consequently accumulate in tumors in a sufficiently high concentration that can be readily detected by CEST MRI. This thus implies that CEST MRI can be used to monitor the vasculature targeted simply using dextran of large size (i.e., >150 kD). Because dextrans are FDA approved and already used clinically, this approach has high translatability potential.

Conclusion: We characterized the CEST properties of dextrans of different MW, and demonstrated their usefulness in delineating the size window of tumor vascular permeability.

References: (1) Chauhan, V. P.; Stylianopoulos, T.; Martin, J. D., et al. Nat Nanotechnol 2012, 7, 383-8. (2) Chan, K. W.; McMahon, M. T.; Kato, Y., et al. Magn. Reson. Med. 2012, 68, 1764-73. (3) Liu, G.; Gilad, A. A.; Bulte, J. W., et al. Contrast Media Mol. Imaging 2010, 5, 162-70. (4) Dreher, M. R.; Liu, W.; Michelich, C. R., et al. J. Natl. Cancer Inst. 2006, 98, 335-44. (5) Armstrong, J. K.; Wenby, R. B.; Meiselman, H. J.; Fisher, T. C. Biophys. J. 2004, 87, 4259-70.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

REFERENCES

1. Chauhan, V. P.; Stylianopoulos, T.; Martin, J. D., et al. *Nat Nanotechnol* 2012, 7, 383-8.
2. Chan, K. W.; McMahon, M. T.; Kato, Y., et al. *Magn. Reson. Med.* 2012, 68, 1764-73.
3. Liu, G.; Gilad, A. A.; Bulte, J. W., et al. *Contrast Media Mol. Imaging* 2010, 5, 162-70.
4. Dreher, M. R.; Liu, W.; Michelich, C. R., et al. *J. Natl. Cancer Inst.* 2006, 98, 335-44.
5. Armstrong, J. K.; Wenby, R. B.; Meiselman, H. J.; Fisher, T. C. *Biophys. J.* 2004, 87, 4259-70.

We claim:

1. A method of assessing tissue vascular permeability for nanotherapeutics using non-labeled dextran, comprising:
    receiving a non-labeled, physiologically-tolerable dextran solution by a subject;
    acquiring a plurality of magnetic resonance images of a distribution of said dextran solution within at least one region of interest of the subject for a corresponding plurality of times; and
    assessing a tissue vascular permeability of said at least one region of interest to dextran particles in said dextran solution based on differences between said plurality of magnetic resonance images,
    wherein said dextran solution is a substantially monodisperse solution of dextran particles of one size.

2. A method of assessing tissue vascular permeability according to claim 1, further comprising, subsequent to said receiving and said acquiring:
    receiving a second, non-labeled, physiologically-tolerable dextran solution by the subject;
    acquiring a second plurality of magnetic resonance images of a distribution of said second dextran solution within the same at least one region of interest for a corresponding plurality of times;
    assessing a second tissue vascular permeability of said at least one region of interest to the second dextran particles based on differences between said second plurality of magnetic resonance images; and determining a range of operability for nanotherapeutics of similar size based on the vascular permeability of the two sizes of dextran particles, wherein said second dextran solution is a substantially mono-disperse solution of dextran particles of one size that is different from the one size of the first dextran solution, wherein said determining a range is based on the first mentioned and the second dextran particles.

3. A method of assessing tissue vascular permeability according to claim 2, further comprising repeating said receiving dextran of a different size and acquiring and assessing steps a plurality of times for a corresponding plurality of dextran solutions.

4. A method of assessing tissue vascular permeability according to claim 2, wherein said second dextran particles have a molecular weight larger than the molecular weight of the first-mentioned dextran particles.

5. A method of assessing tissue vascular permeability according to claim 1, wherein said acquiring is acquiring a plurality of chemical exchange saturation transfer (CEST) magnetic resonance images.

6. A method of assessing tissue vascular permeability according to claim 1, wherein said acquiring is acquiring a plurality of measurements to assess changes in T1rho, T2 or T2* relaxation.

7. A method of assessing tissue vascular permeability according to claim 1, wherein said dextran particles have a molecular weight of at least 3 kD and less than 2,000 kD.

8. A method according to claim 1, further comprising:
acquiring a plurality of magnetic resonance images of a particular chemical or biological agent that modulates the vascular function of the at least one region of interest; and
assessing the tissue vascular permeability of the at least one region of interest based on differences between said plurality of magnetic resonance images of the chemical or biological agent.

9. A method of assessing tissue vascular permeability according to claim 1, wherein the at least one region of interest comprises a tumor.

10. A non-transitory, computer-readable storage medium for assessing tissue vascular permeability using non-labeled dextran, the computer-readable storage medium comprising computer executable instructions that, when executed by a computer, cause the computer to perform:
acquiring a plurality of magnetic resonance images of a distribution of a non-labeled, physiologically-tolerable dextran solution that has been received by a subject, wherein the acquiring step acquires the plurality of magnetic resonance images within at least one region of interest for a corresponding plurality of times; and
assessing a tissue vascular permeability of said at least one region of interest to dextran particles in said dextran solution based on differences between said plurality of magnetic resonance images,
wherein said dextran solution is a substantially mono-disperse solution of dextran particles of one size.

11. The non-transitory, computer-readable storage medium according to claim 10, further comprising instructions that, when executed, subsequent to said receiving and said acquiring, perform:
acquiring a second plurality of magnetic resonance images of a distribution of non-labeled, physiologically-tolerable dextran solution that has been received by a subject, wherein the acquiring step acquires the plurality of magnetic resonance images within the same at least one region of interest for a corresponding plurality of times;
assessing a second tissue vascular permeability of said at least one region of interest to the second dextran particles based on differences between said second plurality of magnetic resonance images; and
determining a range of operability for nanotherapeutics of similar size based on the vascular permeability of the two sizes of dextran particles,
wherein said second dextran solution is a substantially mono-disperse solution of dextran particles of one size that is different from the one size of the first dextran solution, and
wherein said determining a range is based on the first mentioned and the second dextran particles.

12. The non-transitory, computer-readable medium according to claim 11, further comprising repeating said receiving dextran of a different size, acquiring and assessing steps a plurality of times for a corresponding plurality of dextran solutions.

13. The non-transitory, computer-readable medium according to claim 10, wherein said acquiring a plurality of magnetic resonance images is acquiring a plurality chemical exchange saturation transfer (CEST) magnetic resonance images.

14. The non-transitory, computer-readable medium according to claim 10, wherein said acquiring is acquiring a plurality of measurements to assess changes in T1rho, T2 or T2* relaxation.

15. The non-transitory, computer-readable medium according to claim 10, wherein said dextran particles have a molecular weight of at least 3 kD and less than 2,000 kD.

16. The non-transitory, computer-readable medium according to claim 10, wherein said second dextran particles have a molecular weight larger than the first-mentioned dextran particles.

17. A non-transitory, computer-readable medium of claim 10, wherein the computer-readable medium further comprises instructions that when executed cause the computer to perform:
acquiring a plurality of magnetic resonance images of a particular chemical or biological agent that modulates the vascular function of the at least one region of interest; and
assessing the tissue vascular permeability of the at least one region of interest based on differences between said plurality of magnetic resonance images of the chemical or biological agent.

18. The non-transitory, computer-readable medium according to claim 10, wherein the at least one region of interest comprises a tumor.

19. A system for assessing tissue vascular permeability using non-labeled dextran, comprising:
a data processing system; and
a display system configured to communicate with said data processing system,
wherein said data processing system comprises non-transitory, executable instructions that, when executed by said data processing system, causes the data processing system to perform:
acquiring a plurality of magnetic resonance images of a distribution of a non-labeled, physiologically-tolerable dextran solution that has been received by a subject, wherein the acquiring step acquires the plurality of magnetic resonance images within at least one region of interest for a corresponding plurality of times; and assessing a tissue vascular permeability of said at least one region of interest to dextran particles in said dextran solution based on differences between said plurality of magnetic resonance images, wherein said dextran solution is a substantially mono-disperse solution of dextran particles of one size.

20. The system according to claim 19, further comprising computer-executable instructions that, when executed, causes the data processing system to perform subsequent to said receiving and said acquiring:

acquiring a second plurality of magnetic resonance images of a distribution of non-labeled, physiologically-tolerable dextran solution that has been received by a subject, wherein the acquiring step acquires the plurality of magnetic resonance images within the same at least one region of interest for a corresponding plurality of times;

assessing a second tissue vascular permeability of said at least one region of interest to the second dextran particles based on differences between said second plurality of magnetic resonance images; and determining a range of operability for nanotherapeutics of similar size based on the vascular permeability of the two sizes of dextran particles, wherein said second dextran solution is a substantially mono-disperse solution of dextran particles of one size that is different from the one size of the first dextran solution, and wherein said determining a range is based on the first mentioned and the second dextran particles.

21. The system according to claim 19, further comprising computer-executable instructions that, when executed, cause the data processing system to perform repeating said receiving, acquiring and assessing steps a plurality of times for a corresponding plurality of dextran solutions.

22. The system according to claim 19, wherein said acquiring a plurality of magnetic resonance images is acquiring a plurality chemical exchange saturation transfer (CEST) magnetic resonance images.

23. The system according to claim 19, wherein said acquiring is acquiring a plurality of measurements to assess changes in T1rho, T2 or T2*.

24. The system according to claim 19, wherein said dextran particles have a molecular weight of at least 3 kD and less than 2,000 kD.

25. The system according to claim 19, further comprising instructions that when executed by the computer perform:

acquiring a plurality of magnetic resonance images of a particular chemical or biological agent that modulates the vascular function of the at least one region of interest; and assessing the tissue vascular permeability of the at least one region of interest based on differences between said plurality of magnetic resonance images of the chemical or biological agent.

26. The system according to claim 19, wherein the region of interest comprises a tumor.

* * * * *